United States Patent
Kobayashi et al.

(10) Patent No.: US 12,372,866 B2
(45) Date of Patent: *Jul. 29, 2025

(54) IMPRINT APPARATUS AND PRODUCT MANUFACTURING METHOD

(71) Applicant: CANON KABUSHIKI KAISHA, Tokyo (JP)

(72) Inventors: Kenichi Kobayashi, Utsunomiya (JP); Tatsuya Arakawa, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/390,910

(22) Filed: Dec. 20, 2023

(65) Prior Publication Data

US 2024/0126165 A1    Apr. 18, 2024

Related U.S. Application Data

(63) Continuation of application No. 17/544,447, filed on Dec. 7, 2021, now Pat. No. 11,921,423, which is a continuation of application No. 16/673,804, filed on Nov. 4, 2019, now Pat. No. 11,226,554.

(30) Foreign Application Priority Data

Nov. 8, 2018  (JP) ................................. 2018-210917
Nov. 8, 2018  (JP) ................................. 2018-210925

(51) Int. Cl.
  *G03F 7/00*    (2006.01)
(52) U.S. Cl.
  CPC .................. *G03F 7/0002* (2013.01)

(58) Field of Classification Search
  CPC .... G03F 7/0002; G03F 9/7042; G03F 7/2057; G03F 7/70291; F03B 17/04; Y02E 10/20
  See application file for complete search history.

(56) References Cited

U.S. PATENT DOCUMENTS

| | | | | |
|---|---|---|---|---|
| 11,004,683 B2* | 5/2021 | Fukuhara | .............. | G03F 7/0002 |
| 12,153,343 B2* | 11/2024 | Hayashi | ................ | G03F 7/0002 |
| 2018/0301331 A1 | 10/2018 | Yoshida | | |
| 2021/0122089 A1* | 4/2021 | Yoshida | .............. | B29C 35/0805 |
| 2023/0213854 A1* | 7/2023 | Murakami | ............ | G03F 9/7042 |
| | | | | 101/450.1 |

FOREIGN PATENT DOCUMENTS

| | | |
|---|---|---|
| JP | 2013069918 A | 4/2013 |
| JP | 2013102132 A | 5/2013 |
| JP | 2016058735 A | 4/2016 |

(Continued)

*Primary Examiner* — Deoram Persaud
(74) *Attorney, Agent, or Firm* — Canon U.S.A., Inc. IP Division

(57) ABSTRACT

An imprint apparatus executes imprint processing of curing imprint material in a state in which the imprint material supplied onto a substrate and a mold are in contact with each other. The imprint apparatus includes a modulator configured to modulate incident light, a first optical system configured to guide first light from a first light source to the modulator, and second light from a second light source that has a wavelength different from that of the first light to the modulator, and a second optical system configured to guide modulated light modulated by the modulator to the substrate.

14 Claims, 8 Drawing Sheets

(56) References Cited

FOREIGN PATENT DOCUMENTS

| | | | |
|---|---|---|---|
| JP | 2018092996 | A | 6/2018 |
| KR | 20150082162 | A | 7/2015 |
| KR | 20180062391 | A | 6/2018 |
| WO | 2007023681 | A1 | 3/2007 |
| WO | 2013178453 | A1 | 12/2013 |
| WO | 2017110032 | A1 | 6/2017 |
| WO | 2018110237 | A1 | 6/2018 |

* cited by examiner

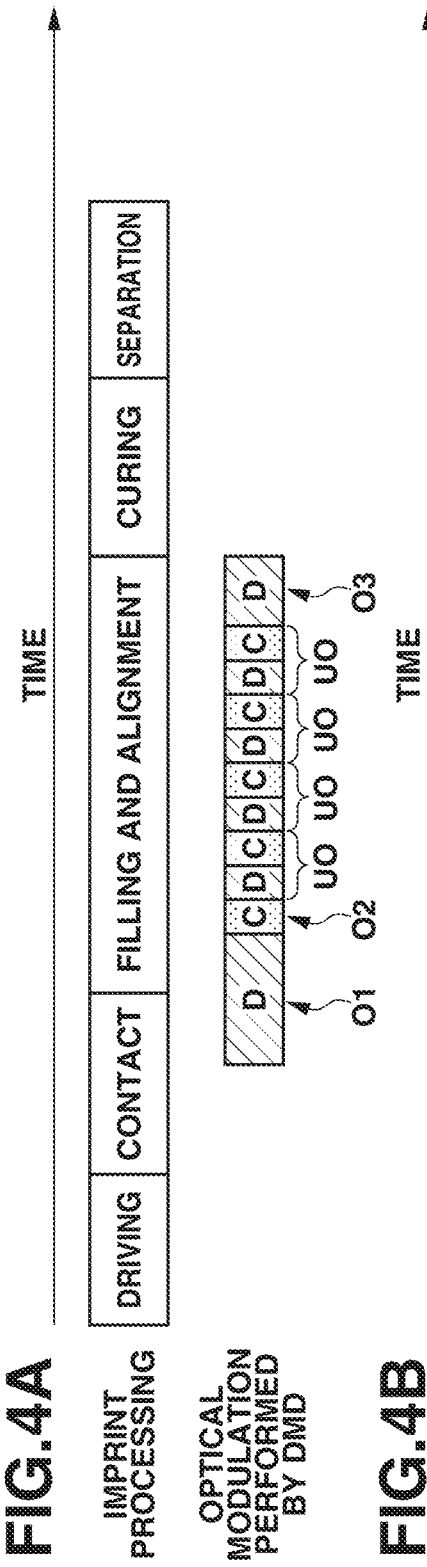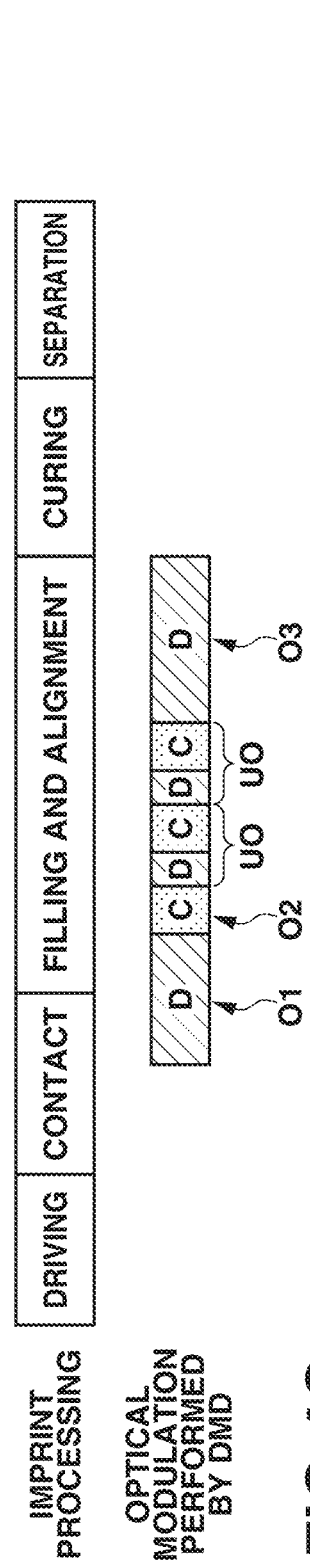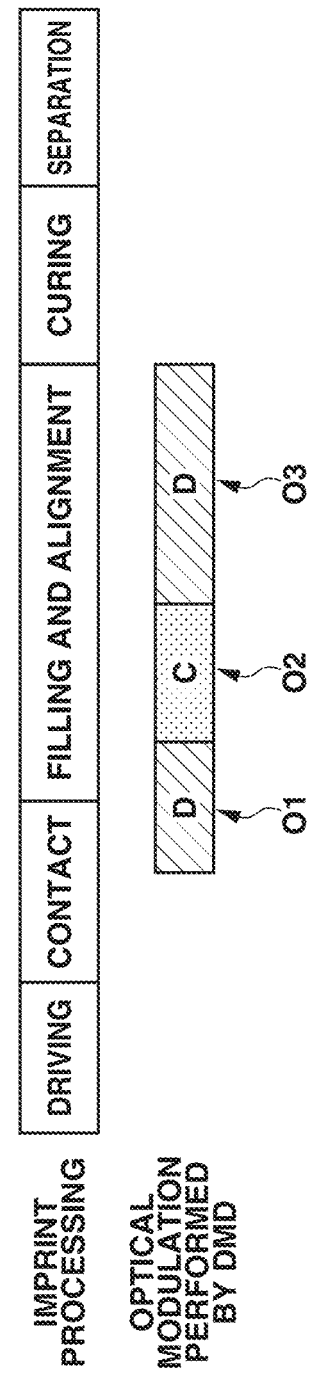

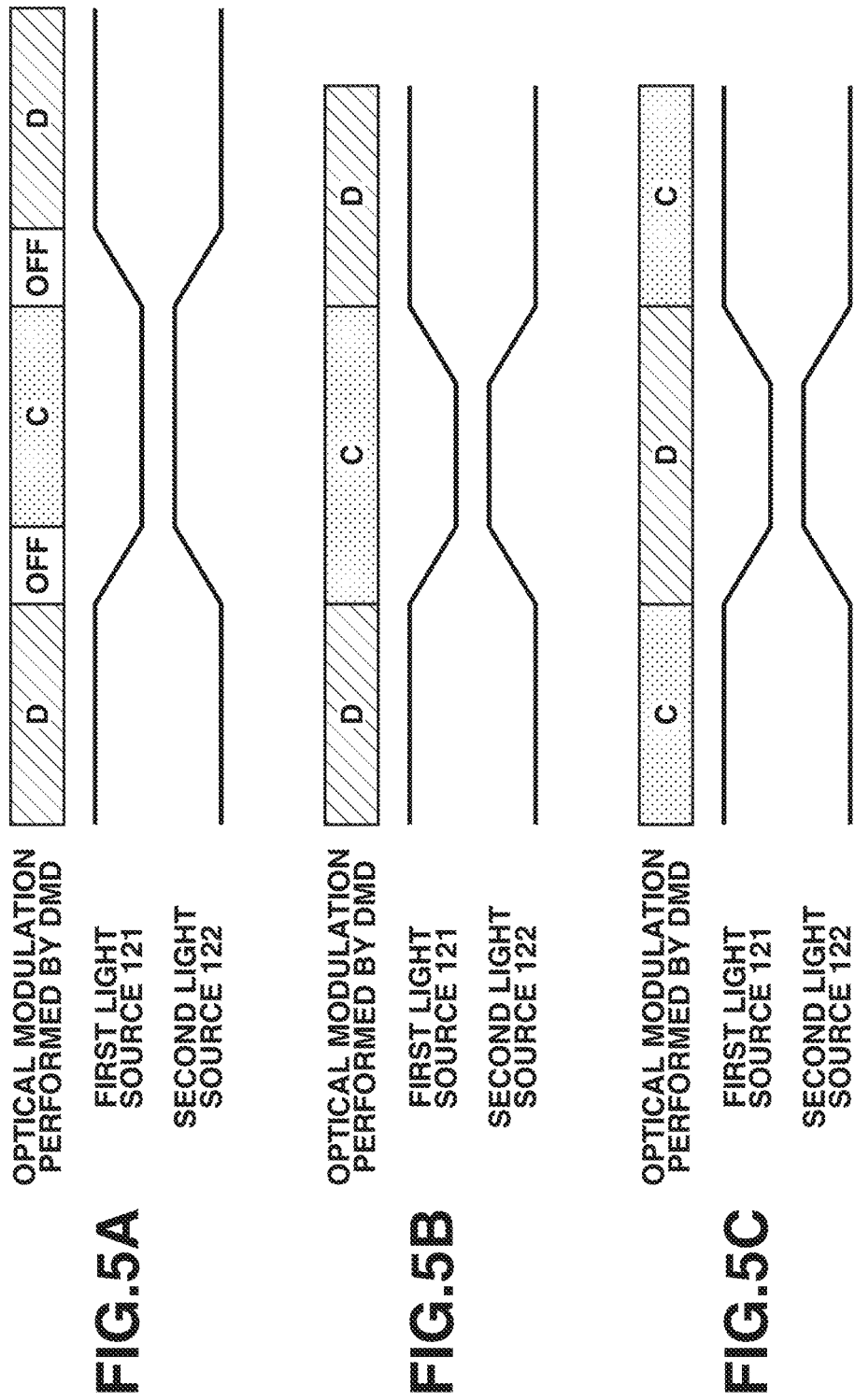

IMPRINT APPARATUS AND PRODUCT MANUFACTURING METHOD

CROSS-REFERENCE TO RELATED APPLICATION

This application is a Continuation of U.S. application Ser. No. 17/544,447, filed Dec. 7, 2021, which is Continuation of U.S. application Ser. No. 16/673,804, filed Nov. 4, 2019, now U.S. Pat. No. 11,226,554, issued Jan. 18, 2022, which claims priority from Japanese Patent Application No. Japanese Patent Applications No. 2018-210917, filed Nov. 8, 2018, and No. 2018-210925, filed Nov. 8, 2018, which are hereby incorporated by reference herein in their entireties.

BACKGROUND

Field of the Disclosure

The present disclosure relates to an imprint apparatus and a product manufacturing method.

Description of the Related Art

As a method of manufacturing a product such as a semiconductor device or a microelectromechanical system (MEMS), there has been known an imprint method of shaping imprint material by bringing imprint material on a substrate and a mold into contact with each other and curing the imprint material in a state in which the mold is in contact with the imprint material.

Japanese Patent Application Laid-Open No. 2013-069918 discusses an imprint apparatus that drips a resist onto a pattern formation region of a substrate, pushes a template against the resist, emits light onto a light irradiated region including a boundary between the pattern formation region and an outer region of the pattern formation region, and then, emits light onto the pattern formation region. By the light emission onto the light irradiated region, the resist on the light irradiated region cures, and the resist is prevented from entering the pattern formation region. Japanese Patent Application Laid-Open No. 2013-102132 discusses an imprint apparatus including a heating mechanism that deforms a pattern region of a substrate by heating, and a shape correcting mechanism that deforms a pattern region of a mold. In addition, Japanese Patent Application Laid-Open No. 2013-102132 discusses that a digital mirror device is used as a unit of forming a heat distribution.

In an imprint apparatus, various devices can be disposed above a mechanism that holds and drives a mold. For example, devices such as a curing unit for curing imprint material on a substrate, a deformation unit for deforming the substrate by emitting light onto the substrate, and a detection system for detecting relative positions of the substrate and the mold can be disposed. Because a region for disposing these devices is finite, it has been very difficult to dispose various devices. In addition, if various devices are disposed, the size of the apparatus might increase.

SUMMARY

According to an aspect of the present invention, an imprint apparatus executes imprint processing of curing imprint material in a state in which the imprint material supplied onto a substrate and a mold are in contact with each other. The imprint apparatus includes a modulator configured to modulate incident light, a first optical system configured to guide first light from a first light source to the modulator, and second light from a second light source that has a wavelength different from that of the first light to the modulator, and a second optical system configured to guide modulated light modulated by the modulator to the substrate.

Further features of the present invention will become apparent from the following description of exemplary embodiments with reference to the attached drawings.

BRIEF DESCRIPTION OF THE DRAWINGS

FIGS. 4A, 4B, and 4C are diagrams respectively illustrating a third operation example, a fourth operation example, and a fifth operation example of a light source unit in imprint processing executed by an imprint apparatus according to an exemplary embodiment of the present invention.

FIGS. 5A, 5B, and 5C are diagrams illustrating three control examples of optical modulation performed by a digital mirror device (DMD), and turning on and off of a first light source and a second light source.

DESCRIPTION OF THE EMBODIMENTS

Figure 1:
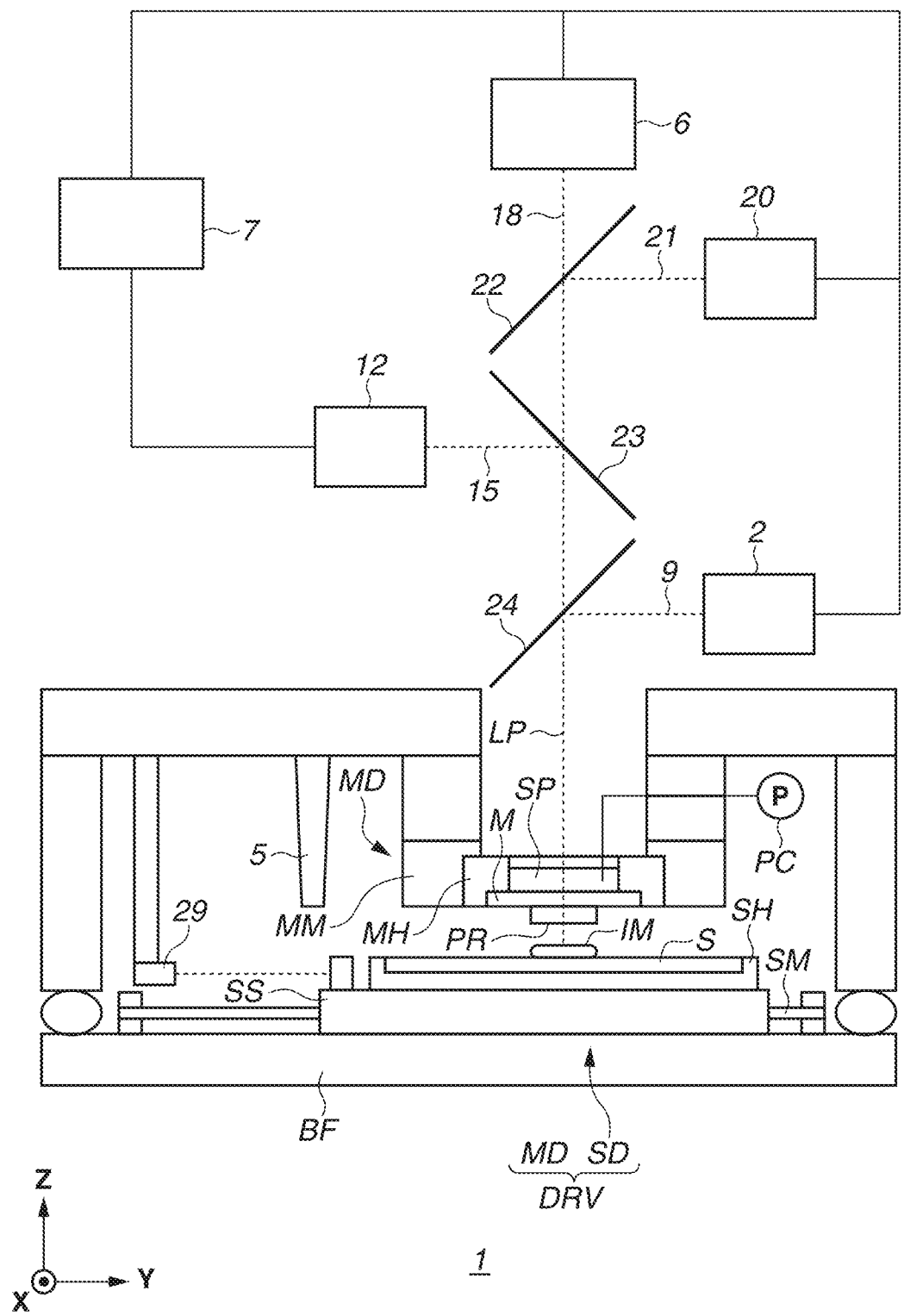
FIG. 1 is a diagram illustrating a configuration of an imprint apparatus according to an exemplary embodiment of the present invention.

Hereinafter, exemplary embodiments of the present invention will be described in detail based on the attached drawings. In the drawings, the same members are assigned the same reference numerals, and the redundant descriptions will be omitted.

Hereinafter, a first exemplary embodiment will be described. FIG. 1 illustrates a configuration of an imprint apparatus 1 according to an exemplary embodiment of the present invention. The imprint apparatus 1 executes imprint processing and thereby forms a pattern on a substrate S. The pattern is made of cured material obtained by curing imprint material IM. The imprint processing can include a contact process of bringing the imprint material IM on the substrate S and a mold M into contact with each other, an alignment process of performing alignment of the substrate S and the mold M after the contact process, and a curing process of curing the imprint material IM after the alignment process.

A curable composition (which may be also referred to as an uncured-state resin) that cures when curing energy is applied thereto is used as the imprint material IM. Examples of the curing energy include electromagnetic waves and heat. As electromagnetic waves, light, such as infrared light, visible light, and ultraviolet light, that has a wavelength selected from the range of 10 nm or more and 1 mm or less, for example, is used.

The curable composition is a composition that cures by being irradiated with light or being heated. A photocurable composition that cures by being irradiated with light at least contains a polymerizable compound and a photopolymerization initiator, and may contain a nonpolymerizable compound or a solvent as necessary. The nonpolymerizable compound is a nonpolymerizable compound of at least one type selected from the group consisting of a sensitizer, a hydrogen donator, an internally-additive mold release agent, a surface-activating agent, an antioxidizing agent, and a polymer component.

The imprint material may be applied onto the substrate in a film shape by a spin coater or a slit coater. Alternatively, the imprint material may be applied onto the substrate by a liquid injection head in a droplet state or in an island shape or a film shape formed by a chain of a plurality of droplets. The viscosity of the imprint material (viscosity at 25° C.) is 1 mPa·s or more and 100 mPa·s or less, for example.

As material of the substrate, for example, glass, ceramics, metal, a semiconductor, or resin can be used. A member made of material different from the material of the substrate may be provided on the surface of the substrate as necessary. The examples of substrate include a silicon wafer, a compound semiconductor wafer, and quartz glass.

In the specification and the attached drawings, directions are defined in an XYZ coordinate system in which a plane parallel to the surface of the substrate S corresponds to an XY-plane. The respective directions parallel to an X-axis, a Y-axis, and a Z-axis in the XYZ coordinate system are represented as an X direction, a Y direction, and a Z direction, respectively, and rotation about the X-axis, rotation about the Y-axis, and rotation about the Z-axis are represented as θX, θY, and θZ, respectively. The control or driving relative to the X-axis, the Y-axis, or the Z-axis means the control or driving relative to a direction parallel to the X-axis, a direction parallel to the Y-axis, or a direction parallel to the Z-axis, respectively. In addition, the control or driving relative to a θX-axis, a θY-axis, or a θZ-axis means the control or driving relative to rotation about an axis parallel to the X-axis, rotation about an axis parallel to the Y-axis, or rotation about an axis parallel to the Z-axis, respectively. In addition, a position is information that can be identified based on coordinates in the X-axis, the Y-axis, and the Z-axis, and orientation is information that can be identified based on values of the θX-axis, the θY-axis, and the θZ-axis. The alignment of the substrate or a region of the substrate and the mold M or a region of the mold M can include the control of the position and/or orientation of at least one of the substrate S and the mold M. In addition, the alignment can include the control for correcting or changing the shape of at least one of the substrate S and the mold M.

The imprint apparatus 1 includes a substrate driving mechanism SD that holds and drives the substrate S, a base frame BF that supports the substrate driving mechanism SD, and a mold driving mechanism MD that holds and drives the mold M. The substrate driving mechanism SD and the mold driving mechanism MD form a driving mechanism DRV that drives at least one of the substrate driving mechanism SD and the mold driving mechanism MD to adjust relative positions of the substrate S and the mold M. The relative position adjustment performed by the driving mechanism DRV includes driving for bringing the mold M into contact with the imprint material IM on the substrate S, and for separating the mold M from the cured imprint material IM (pattern of cured material).

In an imprint method according to the present exemplary embodiment, imprint material is supplied onto the substrate S, and the supplied imprint material is brought into contact with a mold (imprinting). Then, after the imprint material is cured in a state in which the imprint material and the mold are in contact with each other, the mold is separated from the cured imprint material (demolding). The pattern of the imprint material is thereby formed on the substrate. The imprint apparatus 1 according to the present exemplary embodiment brings the imprint material on the substrate and the mold into contact with each other, sufficiently fills a recessed portion of an uneven pattern formed on the mold with the imprint material, and then cures the imprint material by emitting ultraviolet light onto the imprint material. In this manner, the imprint apparatus 1 forms a pattern of cured material onto which an uneven pattern of a mold is transferred, by bringing imprint material supplied onto a substrate and the mold into contact with each other, and supplying the imprint material with curing energy.

The substrate driving mechanism SD includes a substrate holding portion SH that holds the substrate S, a substrate stage SS that holds the substrate holding portion SH, and a substrate driving actuator SM that drives the substrate S by driving the substrate stage SS. The substrate driving mechanism SD is configured to drive the substrate S about a plurality of axes (e.g., three axes including the X-axis, the Y-axis, and θZ-axis, or desirably, six axes including the X-axis, the Y-axis, the Z-axis, the θX-axis, the θY-axis, and the θZ-axis). The position and orientation of the substrate S is controlled based on a measurement result obtained by a measuring device 29 measuring the position and orientation of the substrate S.

The mold driving mechanism MD includes a mold holding portion MH that holds the mold M, and a mold driving actuator MM that drives the mold M by driving the mold holding portion MH. The mold holding portion MH includes a mold deformation mechanism that deforms the mold M. The mold deformation mechanism deforms the mold M by applying force to the side surface of the mold M, for example. The mold driving mechanism MD is configured to drive the mold M about a plurality of axes (e.g., three axes including the Z-axis, the θX-axis, and the θY-axis, or desirably, six axes including the X-axis, the Y-axis, the Z-axis, the θX-axis, the θY-axis, and the θZ-axis). The mold M includes a pattern region in which a pattern to be transferred onto the imprint material IM on the substrate S by the imprint processing is formed. The mold driving mechanism MD includes a pressure regulator PC that deforms (a pattern region PR of) the mold M into a protruding shape protruding toward the substrate S or planarizes the mold M by regulating the pressure in a space SP provided on the rear side of the mold M (opposite side of the pattern region PR). In a state in which the mold M is deformed in a protruding shape protruding toward the substrate S, contact between the imprint material IM on the substrate S and the pattern region PR is started, and then, the pressure regulator PC regulates the pressure in the space SP so as to gradually enlarge a contact region between the imprint material IM and the pattern region PR.

The imprint apparatus 1 includes a dispenser 5 (supply unit) that supplies, applies, or disposes the imprint material IM onto the substrate S. Nevertheless, the imprint material IM may be supplied, applied, or disposed onto the substrate S in an external device of the imprint apparatus 1.

The imprint apparatus 1 includes a light source 2 (curing light source) for emitting light 9 (curing light) for curing the imprint material IM, to a light path LP so that the light 9 is emitted onto the imprint material IM between (a shot region of) the substrate S and (the pattern region PR of) the mold M in the curing process. The light path LP extends up to the substrate S via the mold M and the imprint material IM. The imprint apparatus 1 further includes a detector 12 that detects relative positions of an alignment mark provided on the substrate S and an alignment mark provided on the mold M. The detector 12 illuminates the alignment mark provided on the substrate S and the alignment mark provided on the mold M with detection light 15, and captures images formed by these alignment marks. The detection light 15 can also be understood as light emitted to the light path LP. The detector 12 detects light from an alignment mark.

The mold M is a mold for shaping imprint material on the substrate S. The mold can also be called a template or an original. The mold M has a rectangular external shape, and includes a pattern surface (first surface) on which a pattern (uneven pattern) to be transferred onto (the imprint material on) the substrate S is formed. The mold M can be made of material such as quartz that transmits ultraviolet light (curing light) for curing the imprint material on the substrate S. In the pattern region PR of the mold M, a mold side mark functioning as an alignment mark is formed.

The imprint apparatus 1 further includes an imaging unit 6 for detecting a contact state of the imprint material IM on the substrate S and (the pattern region PR of) the mold M or a filled state of a space between the substrate S and (the pattern region PR of) the mold M with the imprint material IM. Moreover, the imaging unit 6 is also used for detecting a foreign substance existing between the substrate S and the mold M. The imaging unit 6 illuminates a stack structure including the substrate S, the imprint material IM, and the mold M with observation light 18, and captures an image formed by the stack structure. The observation light 18 can also be understood as light emitted to the light path LP.

The imprint apparatus 1 further includes a light source unit 20 that emits modulated light 21 to the light path LP. As described below, the light source unit 20 includes a spatial light modulator, and emits the modulated light 21 obtained by the spatial light modulator modulating incident light, to the light path LP. The modulated light 21 includes first modulated light that deforms the substrate S for the alignment of (the shot region of) the substrate S and (the pattern region PR of) the mold M, and second modulated light that partially cures the imprint material IM. It is desirable that the second modulated light is not emitted to the light path LP when the first modulated light is emitted to the light path LP, and the first modulated light is not emitted to the light path LP when the second modulated light is emitted to the light path LP. Both of the first modulated light and the second modulated light, however, may be emitted to the light path LP as long as the emission period is sufficiently short in a period in which the modulated light 21 is emitted to the light path LP. A wavelength band of the first modulated light and a wavelength band of the second modulated light do not overlap each other. Alternatively, a peak wavelength of the first modulated light and a peak wavelength of the second modulated light are different from each other. Yet alternatively, the intensity of the first modulated light and the intensity of the second modulated light are different from each other.

The first modulated light is light modulated such that a light intensity distribution (illuminance distribution) that allows deformation of the substrate S, more specifically, a pattern formation region (shot region) of the substrate S into a target shape is formed on the substrate S. By the emission of the first modulated light onto the substrate S, a temperature distribution is formed on the substrate S, and the pattern formation region of the substrate S is deformed into the target shape in accordance with the temperature distribution. At a time point at which the pattern formation region of the substrate S is deformed into the target shape and the alignment of the pattern formation region of the substrate S and the pattern region PR of the mold M is completed, a curing process (a process in which curing light is emitted by the curing light source 2 onto the imprint material IM and the imprint material IM is cured) is executed. The first modulated light is light having a wavelength that does not allow curing of the imprint material IM.

The second modulated light has a wavelength that allows curing of the imprint material IM. That is to say, the second modulated light has a wavelength that increases the viscosity (viscous elasticity) of the imprint material IM. The second modulated light can be light modulated so as to cure imprint material IM, of the entire imprint material IM on the substrate S, in a peripheral portion (frame region) of the pattern formation region of the substrate S, for example. The emission of such second modulated light can be called frame exposure (frame cure) and is executed in the contact process and/or the alignment process. The emission of such second modulated light is advantageous to prevent the imprint material IM from being pushed out to the outside of the pattern formation region of the substrate S. The mold M used in the imprint apparatus includes a region called a mesa portion, and the pattern region PR is formed in the mesa portion. By executing the frame exposure, adhesion of the imprint material onto the side surface of the mesa portion having a protruding shape protruding toward the substrate S can be reduced.

The respective optical axes of the curing light source 2, the detector 12, the imaging unit 6, and the light source unit 20 share the light path LP. For realizing this, a compound mirror 22 (a combining mirror) and dichroic mirrors 23 and 24 are provided. The compound mirror 22 transmits the observation light 18 and reflects the modulated light 21. The dichroic mirror 23 transmits the observation light 18 and the modulated light 21, and reflects the detection light 15. The dichroic mirror 24 transmits the observation light 18, the modulated light 21, and the detection light 15, and reflects the curing light 9.

The imprint apparatus 1 can further include a control unit 7 that controls the substrate driving mechanism SD, the mold driving mechanism MD, the pressure regulator PC, the dispenser 5, the measuring device 29, the curing light source 2, the detector 12, the imaging unit 6, and the light source unit 20, which have been described above. The control unit 7 can include, for example, a programmable logic device (PLD) such as a field programmable gate array (FPGA), an application specific integrated circuit (ASIC), a program-installed general-purpose or dedicated computer, or a combination of all or a part of these. The control unit 7 may be provided inside the imprint apparatus 1, or may be installed on a location different from the imprint apparatus 1 and perform remote control.

Configuration of Light Source Unit

Figure 2:
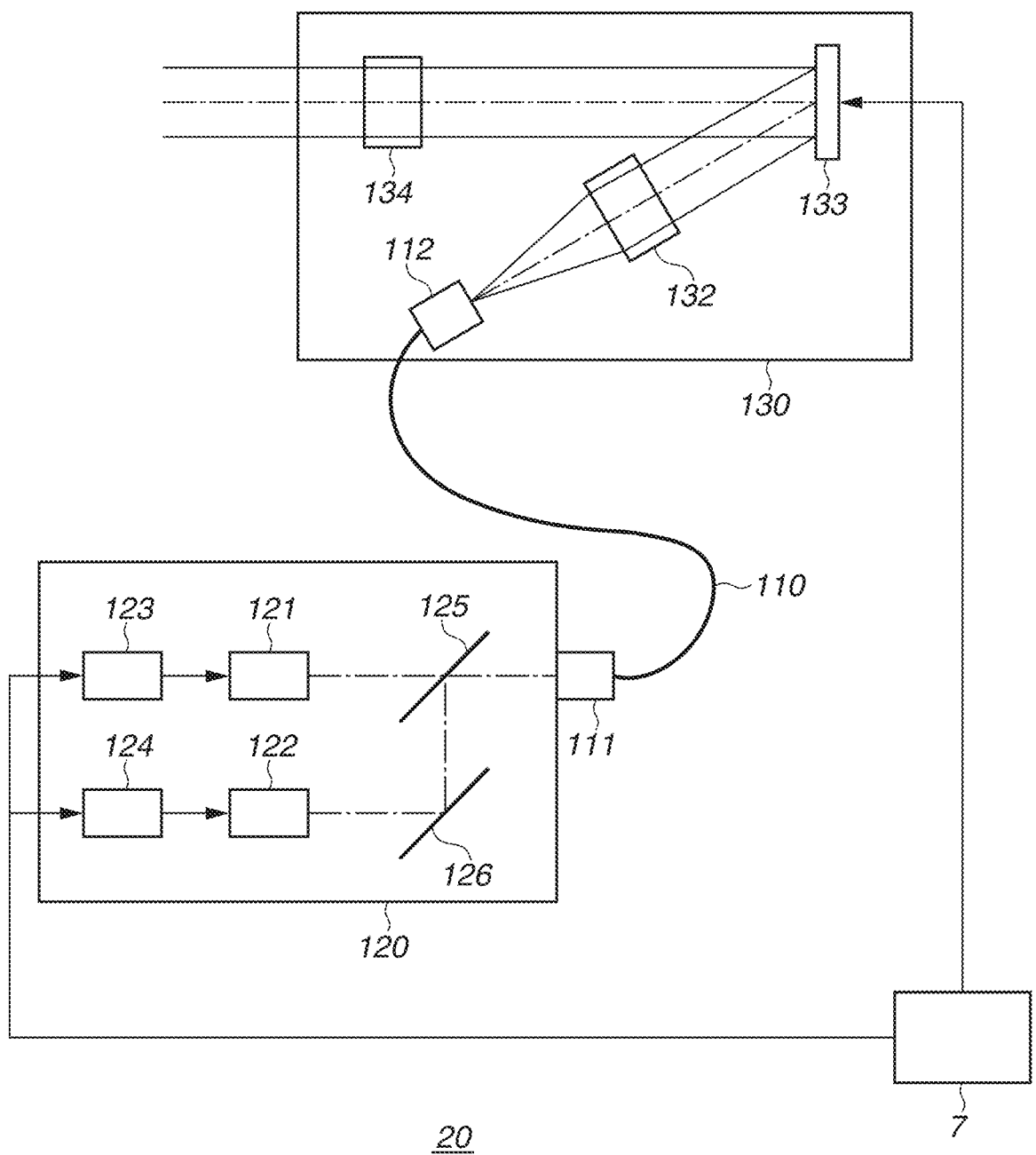
FIG. 2 is a diagram illustrating a configuration example of a light source unit.

FIG. 2 illustrates a configuration example of the light source unit 20. The light source unit 20 includes a first light source 121 that generates first light having a first wavelength band for generating the first modulated light, and a second light source 122 that generates second light having a second wavelength band for generating the second modulated light. The light source unit 20 further includes a digital mirror device (DMD) 133 as a spatial light modulator (modulator) that generates the first modulated light obtained by modulating the first light (incident light), and the second modulated light obtained by modulating the second light (incident light). The light source unit 20 further includes a first optical system (mirrors 125 and 126, entrance portion 111, and optical system 132) that causes the first light from the first light source 121 and the second light from the second light source 122 to enter the DMD 133 functioning as a spatial light modulator.

As an example, the light source unit 20 can include an illumination unit 120 and a modulation unit 130 connected by an optical fiber 110. The illumination unit 120 includes the first light source 121, the second light source 122, a first controller 123, a second controller 124, and the mirrors 125 and 126. The light path of the first light generated by the first light source 121, and the light path of the second light generated by the second light source 122 are combined by the mirrors 125 and 126, and the resultant light path is connected to the entrance portion 111 of the optical fiber 110. An exit portion 112 of the optical fiber 110 is connected to the modulation unit 130.

The first controller 123 controls the first light source 121 in response to a command from the control unit 7. The control of the first light source 121 can include the control of turning on and off of the first light source 121. The control of the first light source 121 may also include the control of the intensity of the first light generated by the first light source 121. For example, the first controller 123 includes a constant electric current circuit that supplies electric current having an electric current value conforming to a command value from the control unit 7, to the first light source 121. Alternatively, the first controller 123 includes a driving circuit that drives the first light source 121 based on a command value, and a photoelectric conversion sensor that partially receives the first light generated by the first light source 121, and is configured to feed back an output of the photoelectric conversion sensor to the driving circuit.

The second controller 124 controls the second light source 122 in response to a command from the control unit 7. The control of the second light source 122 can include the control of turning on and off of the second light source 122. The control of the second light source 122 may also include the control of the intensity of the second light generated by the second light source 122. For example, the second controller 124 includes a constant electric current circuit that supplies electric current having an electric current value conforming to a command value from the control unit 7, to the second light source 122. Alternatively, the second controller 124 includes a driving circuit that drives the second light source 122 based on a command value, and a photoelectric conversion sensor that partially receives the second light generated by the second light source 122, and is configured to feed back an output of the photoelectric conversion sensor to the driving circuit.

The control unit 7 individually controls the first light source 121 and the second light source 122. For example, the control unit 7 can control the first light source 121 and the second light source 122 so as to turn off one of the first light source 121 and the second light source 122 when turning on the other one of the first light source 121 and the second light source 122. In another viewpoint, a configuration in which, when one of the first light from the first light source 121 and the second light from the second light source 122 enters the spatial light modulator (the DMD 133), the other one of the first light and the second light does not enter the spatial light modulator can be employed. This can be implemented by a mechanism that selectively shuts off one of the controls of the first and second light sources 121 and 122 that are respectively performed by the first and second controllers 123 and 124 or one of the first light and the second light, for example.

Wavelength of Light

An example of allocation of wavelengths to the curing light 9, the detection light 15, the observation light 18, and the modulated light 21 (first modulated light, second modulated light) will be described. The curing light 9 is light for curing the imprint material IM, and can have an arbitrary wavelength band within a range of 300 nm to 380 nm as an example, but may have a wavelength band of 300 nm or less. The detection light 15 is light for detecting an alignment mark, and has a wavelength band of 550 nm to 750 nm as an example. The observation light 18 is light for observing a contact state of the imprint material IM and the mold M, and a filled state of the space between the substrate S and the mold M with the imprint material IM. As a wavelength band of the observation light 18, a wavelength band that does not overlap wavelength bands of the curing light 9 and the detection light 15 can be selected from a wavelength band of 400 nm to 480 nm, for example. The modulated light 21 includes the first modulated light having a wavelength band that does not allow curing of the imprint material IM, and the second modulated light having a wavelength band that allows curing of the imprint material IM.

As a wavelength band of the modulated light 21, a wavelength band similar to that of the observation light 18 can be selected. For example, a wavelength band that does not overlap wavelength bands of the curing light 9 and the detection light 15 can be selected from a wavelength band of 400 nm to 480 nm. The first modulated light is generated by the modulation unit 130 (the DMD 133) modulating the first light generated by the first light source 121. The second modulated light is generated by the modulation unit 130 (the DMD 133) modulating the second light generated by the second light source 122. Wavelengths of the first light generated by the first light source 121 and the second light generated by the second light source 122 can be determined based on an upper limit of a wavelength band in which the imprint material IM cures. For example, if an upper limit of a wavelength band in which the imprint material IM cures is 440 nm, the wavelength of the first light generated by the first light source 121 can be set to about 460 nm, and the wavelength of the second light generated by the second light source 122 can be set to about 410 nm. The first light source 121 and the second light source 122 desirably generate single-wavelength light having a narrow wavelength width, and for example, a laser diode is suitable. Laser diodes are excellent in that turning on and off can be switched at high speed.

Light transmitted to the modulation unit 130 via the optical fiber 110 enters the DMD 133 functioning as a spatial light modulator, via the optical system 132. The optical system 132 can include, for example, a light-collecting optical system and an illumination system (e.g., microlens array) that uniformizes light from the light-collecting optical system and illuminates the DMD 133. The DMD 133 includes a plurality of micromirrors (not illustrated) that each reflects light, and actuators that respectively drive the plurality of micromirrors. In response to a command from the control unit 7, each of the actuators controls an angle of a corresponding micromirror to −12 degrees (ON state) or +12 degrees (OFF state) with respect to an array surface of the plurality of micromirrors. Light reflected by a micromirror in the ON state forms, as modulated light, an image on the substrate S via a projection optical system 134 (second optical system) that brings the DMD 133 and the substrate S into an optically-conjugate relationship. Light reflected by a micromirror in the OFF state is reflected in a direction in which the light does not reach the substrate S. A region projected on the substrate S when all the micromirrors are brought into the ON state (maximum irradiated region) is larger than the size of the maximum pattern formation region (shot region) of the substrate S. Considering that the second modulated light is emitted to the peripheral portion (frame region) of the pattern formation region of the substrate S, the maximum irradiated region can be set a region larger than the maximum pattern formation region by 1 mm or more. Another spatial light modulator such as a liquid crystal display (LCD) may be employed in place of the DMD 133.

The optical systems included in the modulation unit 130 transmit both of the first light (first modulated light) having a wavelength that does not allow curing of the imprint material IM, and the second light (second modulated light) having a wavelength that allows curing of the imprint material IM. In a general DMD, the maximum light intensity of light that can be emitted onto a micromirror array decreases in a wavelength of 420 nm or less, and furthermore, in the vicinity of 400 nm being a boundary between ultraviolet light and visible light, the maximum light intensity of light that can be emitted onto a micromirror array drastically decreases to about $1/1000$. It is therefore desirable to bring the wavelength of the first light source 121 and the wavelength of the second light source 122 closer to the vicinity of the upper limit of a wavelength band in which the imprint material IM cures, using a laser diode having a short wavelength width.

For example, based on light intensity distribution (illuminance distribution) data to be formed on the surface of the substrate S, the control unit 7 can generate control data for controlling the switching between the ON state and the OFF state of each micromirror of the DMD 133. The light intensity distribution data can include information regarding a time in which each micromirror is kept in the ON state, and information regarding a time in which each micromirror is kept in the OFF state, for example. As the number of micromirrors being in the ON state increases, and as the time of the ON state becomes longer, the pattern formation region of the substrate S can be exposed with a larger exposure amount.

The control unit 7 includes a memory that stores light intensity distribution data for generating the first modulated light by modulating the first light, and light intensity distribution data for generating the second modulated light by modulating the second light. The light intensity distribution data for generating the first modulated light by modulating the first light includes light intensity distribution data for deforming the pattern formation region (shot region) of the substrate S into a target shape. The light intensity distribution data for generating the second modulated light by modulating the second light includes light intensity distribution data for curing (increasing the viscosity of) a portion of the imprint material IM on the substrate S, which corresponds to the peripheral portion (frame region) of the pattern formation region of the substrate S.

A configuration in which the modulation unit 130 is shared by the first light source 121 and the second light source 122 is advantageous to downsize the modulation unit 130 or the light source unit 20, and thereby the structure of the imprint apparatus 1 can be simplified. This can make it easier to dispose the modulation unit 130 near the light path LP. A configuration in which the illumination unit 120 and the modulation unit 130 are separated from each other is advantageous to dispose the illumination unit 120 functioning as a heat source, at a position distant from the light path LP of the imprint apparatus 1. Nevertheless, the illumination unit 120 and the modulation unit 130 may be disposed in proximity to each other without using the optical fiber 110. Alternatively, the illumination unit 120 may be incorporated into the modulation unit 130. Yet alternatively, the first light source 121 and the modulation unit 130 may be connected by a first optical fiber, and the second light source 122 and the modulation unit 130 may be connected by a second optical fiber. In this case, a light path of first light emitted from the first optical fiber and a light path of second light emitted from the second optical fiber can be coupled.

Operation of Light Source Unit

Figure 3A:
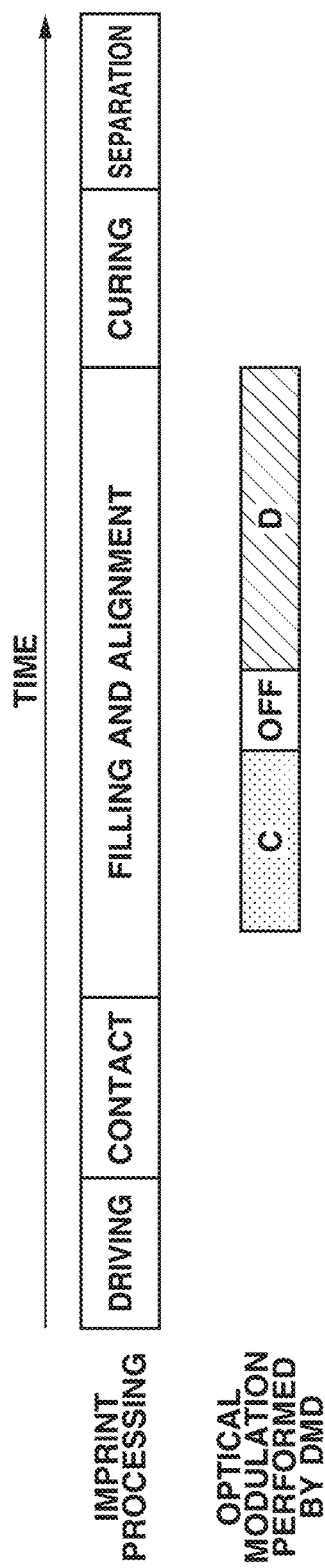
FIGS. 3A and 3B are diagrams respectively illustrating a first operation example and a second operation example of a light source unit in imprint processing executed by an imprint apparatus according to an exemplary embodiment of the present invention.

FIG. 3A illustrates a first operation example of the light source unit 20 in imprint processing executed by the imprint apparatus 1. In FIG. 3A, the "imprint processing" indicates the progress of imprint processing. The imprint processing includes a contact process of bringing the imprint material IM on the substrate S and the mold M into contact with each other, an alignment process of performing alignment of the substrate S and the mold M after the contact process, and a curing process of curing the imprint material IM after the alignment process. The contact process is a process of bringing the imprint material IM on the substrate S and (the pattern region PR of) the mold M into contact with each other using the driving mechanism DRV. The contact process is started upon the start of contact between the imprint material IM on the substrate S and the pattern region PR of the mold M deformed into a protruding shape, and is ended when the entire region of the pattern region PR is planarized, for example. The imprint processing includes, as a process accompanied by the contact process, a driving process of bringing the imprint material IM on the substrate S and the mold M closer to each other using the driving mechanism DRV, and the process is described as "driving" in FIG. 3A.

In the alignment process, based on a result detected by the detector 12, at least one of the substrate S and the mold M is driven by the driving mechanism DRV so that the pattern formation region of the substrate S and the pattern region PR of the mold M are aligned. In addition, in the alignment process, based on a result detected by the detector 12, the mold M can be deformed by the mold driving mechanism so that the pattern formation region (shot region) of the substrate S and the pattern region PR of the mold M are aligned. In addition, in the alignment process, based on a result detected by the detector 12, an undermentioned deformation process can be executed so that the pattern formation region of the substrate S and the pattern region PR of the mold M are aligned.

Concurrently with the alignment process, a filling process is executed. In the filling process, a recessed portion included in the pattern in the pattern region PR is filled with the imprint material IM existing between the substrate S and the pattern region PR of the mold M, and an airspace existing between the substrate S and the pattern region PR of the mold M disappears. The alignment process and the filling process are described as "filling and alignment" in FIG. 3A. As an example, the filling process can be started prior to the alignment process. In addition, in FIG. 3A, a curing process is described as "curing" and a separation process is described as "separation".

In FIG. 3A, "optical modulation performed by DMD" indicates optical modulation performed by the DMD 133 of the light source unit 20. A partial curing process C, described as "C" in FIG. 3A, indicates that the second modulated light generated by modulating the second light having a wavelength band that allows curing of (increases the viscosity of) the imprint material IM is emitted to the light path LP. In the partial curing process C according to the first exemplary embodiment, the imprint material IM in the above-described frame region is cured (frame exposure is performed). A deformation process D, described as "D" in FIG. 3A, indicates that the first modulated light generated by modulating the first light having a wavelength band that does not allow curing of the imprint material IM is emitted to the light path LP. In the deformation process D, the pattern formation region of the substrate S is deformed to perform the alignment of the pattern formation region of the substrate S and the pattern region PR of the mold M. A period "OFF" in FIG. 3A indicates that neither the first modulated light nor the second modulated light is emitted to the light path LP. During the period "OFF", the DMD 133 is controlled and a light intensity distribution is switched from a light intensity distribution of the first modulated light to a light intensity distribution of the second modulated light.

A period (timing, time length) of the partial curing process C in which frame exposure is performed can be determined so as to prevent the imprint material IM from being pushed out to the outside of the pattern formation region of the substrate S, by curing the imprint material IM in the frame region. A period (timing, time length) of the deformation process D can be determined so that the shape of the pattern formation region of the substrate S becomes a target shape at a time point at which the imprint material IM is cured by the curing light 9 from the curing light source 2 in the curing process. It is desirable that the substrate S is deformed at least during the alignment period, and the deformation process D is completed before the start of the curing process.

In the first exemplary embodiment, the description has been given of an example in which the partial curing process C is performed before the deformation process D is performed. The execution order of the processes is, however, not limited thereto. The processes may be executed in an opposite order or repeatedly executed a plurality of times.

Figure 3B:
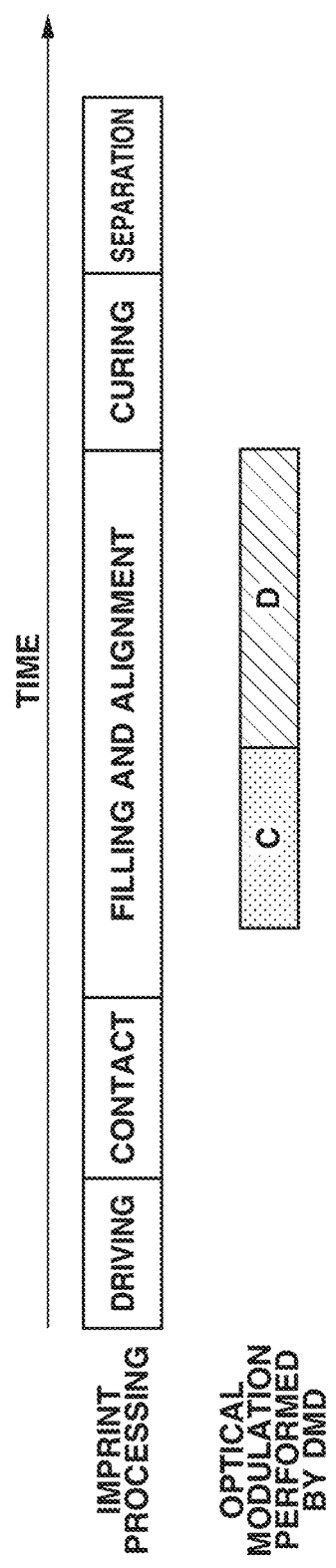

FIG. 3B illustrates a second operation example of the light source unit 20 in imprint processing executed by the imprint apparatus 1. A description method conforms to the description method in FIG. 3A. In the second operation example illustrated in FIG. 3B, the period "OFF" in the example illustrated in FIG. 3A is omitted or shortened. The period of the partial curing process C and the period of the deformation process D cannot be overlapped. Under one conceivable constraint, the partial curing process C is not executed in the contact process. This is because, if the imprint material IM is cured in the contact process even partially, the imprint material IM is prevented from spreading, and the filling in the subsequent filling process is disturbed. Under such a constraint, in a case where the deformation process D is executed after the partial curing process C, a time required for the alignment process and the filling process that progress concurrently with each other cannot be made shorter than a total time of the period of the partial curing process C and the period of the deformation process D.

In the partial curing process C, frame exposure is executed as described above. The execution period of the frame exposure is determined so as to prevent the imprint material IM from being pushed out to the outside of the pattern formation region of the substrate S (pattern region PR of the mold M).

In the partial curing process C, vibration control exposure is executed as described above. The execution time of the vibration control exposure is determined so as to reduce relative vibration between the substrate S and the mold M and enhance a convergence property of the alignment.

Figure 6A:
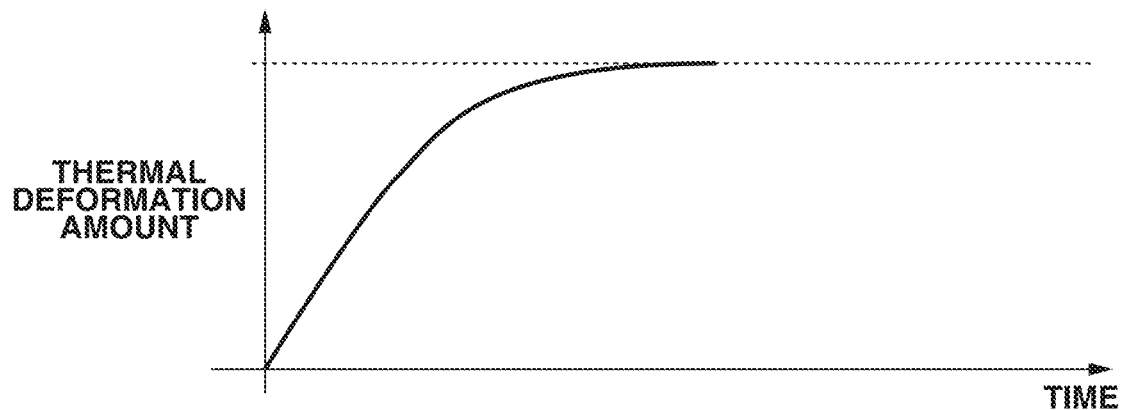
FIGS. 6A, 6B, and 6C are diagrams each illustrating a temporal change in deformation amount (thermal deformation amount) of a pattern region of a substrate.

FIG. 6A illustrates an example of a temporal change in deformation amount (thermal deformation amount) of (the pattern formation region of) the substrate S in the deformation process D in the first and second operation examples respectively illustrated in FIGS. 3A and 3B. A change in deformation amount can be represented by a function including an exponential function, for example. By preliminarily obtaining a time constant of the exponential function, it is possible to determine the time of each deformation process D and a start timing of the deformation process D. In addition, the intensity of the first light may be adjusted.

In this manner, by using the common modulation unit 130 (the DMD 133) for light sources having different wavelengths, it is possible to provide a plurality of functions in an imprint apparatus without complicating the structure of the apparatus.

Hereinafter, a second exemplary embodiment will be described. FIGS. 4A, 4B and 4C respectively illustrate third, fourth, and fifth operation examples of the imprint apparatus. The description method confirms to the description method in FIG. 3A. The third, fourth, and fifth operation examples can include at least a first operation O1, a second operation O2, and a third operation O3. In the first operation O1, the first modulated light that does not cure the imprint material IM is supplied to the light path LP (i.e., the deformation process D is executed). The second operation O2 is executed after the first operation O1, and in the second operation O2, the second modulated light that cures the imprint material IM is supplied to the light path LP (i.e., the partial curing process C is executed). The third operation O3 is executed after the second operation O2, and in the third operation O3, the first modulated light that does not cure the imprint material IM is supplied to the light path LP (i.e., the deformation process D is executed). The second operation O2 and the third operation O3 can be executed concurrently with the alignment process. In another viewpoint, the second operation O2 can be started after the start of the alignment process.

The first operation O1 is started before the start of the alignment process. As an example, the first operation O1 is started in the contact process (more specifically, at an arbitrary timing in the contact process). Alternatively, the first operation O1 can be started after the start of the alignment process. The third operation O3 can be executed so that the deformation of (the pattern formation region of) the substrate S for the alignment of the substrate S and the mold M is completed at the start of the curing process. Alternatively, the first operation O1 and the third operation O3 can be executed so that the deformation of (the pattern formation region of) the substrate S for the alignment of the substrate S and the mold M is completed at the start of the curing process. In the third, fourth, and fifth operation examples, the deformation process D and the partial curing process C that can be only exclusively executed and have constraints on the respective execution times appear to be concurrently executed.

A unit operation UO can be executed at least once between the second operation O2 and the third operation O3. The unit operation UO includes an operation in which the first modulated light is supplied to the light path LP (deformation process D) and an operation in which the second modulated light is supplied to the light path LP (partial curing process C). The deformation process D serving as the first operation O1, the deformation process D serving as the third operation O3, and the deformation process D in the unit operation UO can be executed so that the deformation of (the pattern formation region of) the substrate S for the alignment of the substrate S and the mold M is completed at the start of the curing process.

The partial curing process C can include the frame exposure and/or vibration control exposure as above described.

The execution period of the frame exposure is determined so as to prevent the imprint material IM from being pushed out to the outside of the pattern formation region of the substrate S. The vibration control exposure is executed so as to reduce relative vibration between the substrate S and the mold M and enhance a convergence property of alignment. In a case where both of the frame exposure and the vibration control exposure are executed, typically, the frame exposure is executed prior to the vibration control exposure.

In a procedure of executing the second operation O2 (partial curing process) after the first operation O1 (deformation process), and then executing the third operation O3 (deformation process) after the second operation O2, the temperature of the substrate S can decrease (i.e., the substrate S can release heat) after the end of the first operation O1. Thus, in the deformation process D to be executed thereafter, the temperature decrease needs to be compensated for. Nevertheless, because the execution timing of the second operation O2 (frame exposure and/or vibration control exposure) is restricted depending on the purpose, it is possible to shorten the execution time of the third operation O3 to be executed after the second operation O2 by executing the first operation O1 prior to the second operation O2. In addition, the first operation O1 can be started before the start of the alignment process.

In the first and second operation examples respectively illustrated in FIGS. 3A and 3B, the partial curing process C and the deformation process D are normally started after the start of the alignment process and the filling process. This can impose restrictions on the shortening of the alignment process and the filling process. In other words, the execution time of the alignment process and the filling process cannot be made shorter than a time required for both of the partial curing process C and the deformation process D. On the other hand, in the third, fourth, and fifth operation examples respectively illustrated in FIGS. 4A, 4B, and 4C, the execution time of the alignment process and the filling process may be shorter than a required time from the start of the first operation O1 to the end of the third operation O3. This enables the deformation process D and the partial curing process C to be executed under the time constraints imposed on the processes, while shortening the execution time of the alignment process and the filling process as much as possible.

In the third and fourth operation examples respectively illustrated in FIGS. 4A and 4B, the unit operation UO including the deformation process D and the partial curing process C is executed at least once or a plurality of times between the second operation O2 and the third operation O3. A time ratio between the deformation process D and the partial curing process C included in the unit operation UO can be arbitrarily set. In a case where the unit operation UO is executed a plurality of times, the ratio may be individually set for each of the unit operations UO. In the third and fourth operation examples, the time of each partial curing process C is shortened. This is advantageous to reduce heat release of the substrate S in each partial curing process C. The time of each partial curing process C may be determined such that the deformation of the substrate S caused by heat release of the substrate S within the time can be regarded as deformation in a linear shape. This is advantageous to more easily determine a heat input amount of the substrate S (emission amount of first modulated light) in each deformation process D.

In the fifth operation example illustrated in FIG. 4C, the unit operation UO is not inserted between the second operation O2 and the third operation O3. Thus, the time of the second operation O2 can be increased, and a temperature decrease of the substrate S in the time can be large. In the fifth operation example, meanwhile, the number of times of switching between the deformation process D and the partial curing process C is small. This is advantageous to reduce a time required for switching, and/or to simplify a control parameter (control information) for controlling operations.

In the third, fourth, and fifth operation examples respectively illustrated in FIGS. 4A, 4B, and 4C, the first operation O1 is started in the contact process, but the first operation O1 may be started after the start of the alignment process. Also in this case, the deformation process D and the partial curing process C that can be only exclusively executed and have constraints on the respective execution times appear to be concurrently executed.

FIG. 5A illustrates an example of the control of optical modulation performed by the DMD 133, and turning on and off of the first light source 121 and the second light source 122. Because the turning on and off of the first light source 121 and the second light source 122 have transient response characteristics, it is difficult to control the turning on and off of the first light source 121 and the second light source 122 completely exclusively. In other words, the first light source 121 and the second light source 122 can enter an intermediate state between the on state and the off state. In a case where the first light source 121 and the second light source 122 are in a transient state, both of the first light from the first light source 121 and the second light from the second light source 122 can enter the DMD 133. If the DMD 133 performs a modulation operation in this state, both of light obtained by modulating the first light and light obtained by modulating the second light can be emitted to the light path LP. This can cause undesirable deformation of the substrate S due to light obtained by disorderly modulating the second light by the DMD 133.

Thus, in the example illustrated in FIG. 5A, during a period in which the first light source 121 and the second light source 122 are in the transient state, the DMD 133 is controlled to be in the OFF state in which light from the DMD 133 is not emitted to the light path LP. In addition, as an example, it takes about 100 microseconds for switching between the turning on and off of the first light source 121 and the second light source 122, and it takes about 10 microseconds for switching between patterns of the DMD 133 (switching between modulation states), for example.

FIG. 5B illustrates another example of the control of optical modulation performed by the DMD 133, and turning on and off of the first light source 121 and the second light source 122. In the example illustrated in FIG. 5B, an intentional OFF period when the DMD 133 is in the OFF state is omitted or shortened. Such control is advantageous to enhance throughput. In a state in which the DMD 133 is modulated for the partial curing process C, an amount of deformation of the substrate S that is caused by the first light that does not cure the imprint material IM (light for the deformation process D) in a transient time is sometimes ignorable. In this case, after the DMD 133 is changed from a modulation state for the deformation process D to a modulation state for the partial curing process C, the first light source 121 that generates the first light can be changed from the on state to the off state, and the second light source 122 that generates the second light can be changed from the off state to the on state. In addition, after the first light source 121 that generates the first light is changed from the off state to the on state and the second light source 122 that generates the second light is changed from the on state to the off state, the DMD 133 can be changed from the modulation state for the partial curing process C to the modulation state for the deformation process D.

FIG. 5C illustrates yet another example of the control of optical modulation performed by the DMD 133, and turning on and off of the first light source 121 and the second light source 122. In the example illustrated in FIG. 5C, an intentional OFF period when the DMD 133 is in the OFF state is omitted or shortened. Such control is advantageous to enhance throughput. In a state in which the DMD 133 is modulated for the deformation process D, an amount of deformation of the substrate S that is caused by the second light that cures the imprint material IM (light for the partial curing process C) in a transient time is sometimes ignorable. In this case, after the DMD 133 is changed from a modulation state for the partial curing process C to a modulation state for the deformation process D, the first light source 121 that generates the first light can be changed from the off state to the on state, and the second light source 122 that generates the second light can be changed from the on state to the off state. In addition, after the first light source 121 that generates the first light is changed from the off state to the on state and the second light source 122 that generates the second light is changed from the on state to the off state, the DMD 133 can be changed from the modulation state for the deformation process D to the modulation state for the partial curing process C.

Figure 6B:
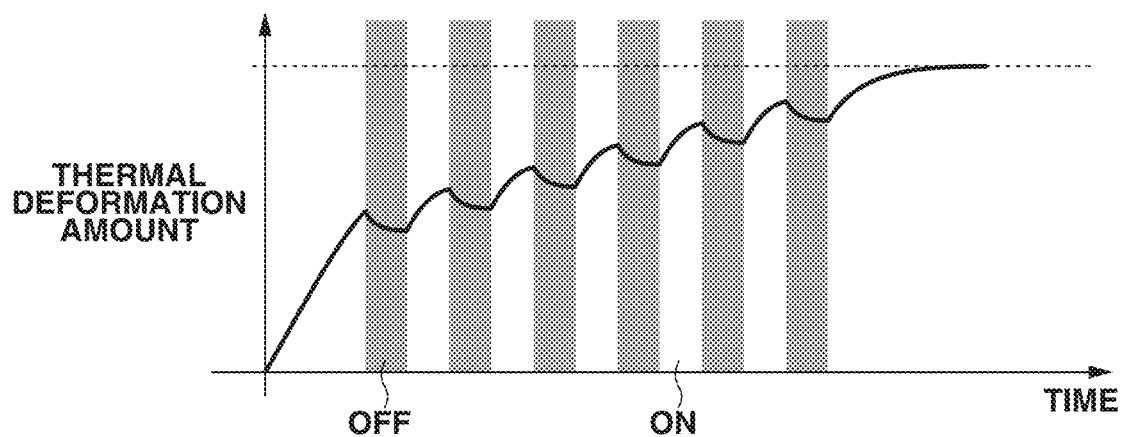
Figure 6C:
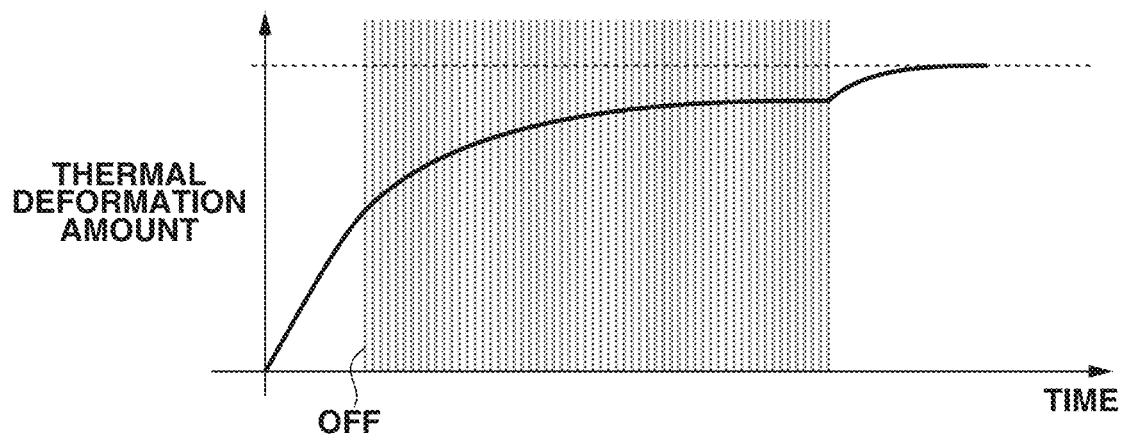

FIG. 6B illustrates an example of a temporal change in deformation amount (thermal deformation amount) of (the pattern formation region of) the substrate S that is caused in a case where the first, second, and third operations accompanied by a plurality of unit operations UO are executed in accordance with the third and fourth operation examples respectively illustrated in FIGS. 4B and 4C. In FIGS. 6B and 6C, a white portion (ON) indicates the deformation process D and a gray portion (OFF) indicates the partial curing process C. In the partial curing process C (OFF), because the first modulated light is not emitted onto the substrate S, an amount of deformation caused by thermal expansion decreases. The subsequent deformation process D (ON) is, thus, to be controlled considering an amount for compensating for the decrease in deformation amount. A change in deformation amount can be represented by a function including an exponential function, for example. By preliminarily obtaining a time constant of the exponential function, it is possible to determine the time of each deformation process D and a time ratio between the deformation process D and the partial curing process C. In addition, the intensity of the first light may be adjusted.

The example illustrated in FIG. 6B and the example illustrated in FIG. 6C indicate a difference in change in thermal deformation amount that is obtained in a case where an execution time of each unit operation UO including the deformation process D and the partial curing process C (as a result, the number of times of the repeated unit operations UO) is varied. The example illustrated in FIG. 6B is advantageous to enhance throughput in that the number of times of switching between the deformation process D and the partial curing process C is small. Meanwhile, in the example illustrated in FIG. 6C, because the time of each unit operation UO is short, the amount of thermal deformation can be controlled regarding a change in thermal deformation amount in each unit operation UO as a change in a linear shape. In addition, in the example illustrated in FIG. 6C, an increase/decrease width of a thermal deformation amount can be reduced, and the deformation of the pattern formation region of the substrate S can be precisely controlled.

Hereinafter, a third exemplary embodiment will be described. In the first and second exemplary embodiments, the description has been given of a case where light for increasing the viscosity of the imprint material in the peripheral portion of the shot region is emitted as the second modulated light.

Second modulated light according to the third exemplary embodiment can be light modulated so as to increase the viscosity of the imprint material IM at an arbitrary point of the pattern formation region of the substrate S, and thereby strengthen bonding force exerted between the substrate S and the mold M by the imprint material IM. The emission of such second modulated light that can be referred to as a vibration control exposure is executed in the alignment process, and can enhance alignment accuracy. In a state in which bonding force exerted between the substrate S and the mold M by the imprint material IM is weak (before the emission of the second modulated light), the substrate S and the mold M can individually vibrate by disturbance (i.e., relative vibration between the substrate S and the mold M is large). By partially increasing the viscosity of the imprint material IM by emitting the second modulated light onto the imprint material IM, and strengthening bonding force exerted between the substrate S and the mold M, it is possible to reduce relative vibration between the substrate S and the mold M, and enhance a convergence property of alignment. As an example, in order to enhance the convergence property of alignment, it is effective to increase the viscosity (viscous elasticity) of the imprint material IM by the emission of the second modulated light such that the magnitude of shear force generated by a relative movement between the substrate S and the mold M falls within a range of 0.5 N to 1.0 N.

In addition, a control unit 7 according to the third exemplary embodiment includes a memory that stores light intensity distribution data for generating the first modulated light by modulating the first light, and light intensity distribution data for generating the second modulated light by modulating the second light. The light intensity distribution data for generating the second modulated light by modulating the second light includes light intensity distribution data for increasing the viscosity of the imprint material IM at an arbitrary point of the pattern formation region of the substrate S and strengthening bonding force exerted between the substrate S and the mold M via the imprint material IM.

In the partial curing process C according to the third exemplary embodiment, the viscosity of the imprint material IM at an arbitrary point of the pattern formation region of the substrate S is increased (vibration control exposure is executed).

In addition, a period (timing, time length) of the partial curing process C in which the vibration control exposure is performed can be determined so as to reduce relative vibration between the substrate S and the mold M by partially increasing the viscosity of the imprint material IM and strengthening bonding force exerted between the substrate S and the mold M.

In this manner, by using the common modulation unit 130 (the DMD 133) for light sources having different wavelengths, it is possible to provide a mechanism of deforming the substrate and a mechanism of increasing the viscosity of the imprint material (vibration control exposure mechanism), without complicating the structure of the apparatus.

Hereinafter, a fourth exemplary embodiment will be described. In the first and second exemplary embodiments, the description has been given of a case where light modulated such that a light intensity distribution (illuminance distribution) for deforming the pattern formation region (shot region) of the substrate S into a target shape is formed on the substrate S is emitted as the first modulated light.

First modulated light according to the fourth exemplary embodiment can be light modulated so as to increase the viscosity of the imprint material IM at an arbitrary point of the pattern formation region of the substrate S, and thereby strengthening bonding force exerted between the substrate S and the mold M by the imprint material IM. The emission of such first modulated light that can be referred to as a vibration control exposure is executed in the alignment process, and can enhance alignment accuracy. In a state in which bonding force exerted between the substrate S and the mold M by the imprint material IM is weak (before the emission of the first modulated light), the substrate S and the mold M can individually vibrate by disturbance (i.e., relative vibration between the substrate S and the mold M is large). By partially increasing the viscosity of the imprint material IM by emitting the first modulated light onto the imprint material IM, and strengthening bonding force exerted between the substrate S and the mold M, it is possible to reduce relative vibration between the substrate S and the mold M, and enhance a convergence property of alignment. As an example, in order to enhance the convergence property of alignment, it is effective to increase the viscosity (viscous elasticity) of the imprint material IM by the emission of the first modulated light such that the magnitude of shear force generated by a relative movement between the substrate S and the mold M falls within a range of 0.5 N to 1.0 N.

In addition, a control unit 7 according to the fourth exemplary embodiment includes a memory that stores light intensity distribution data for generating the first modulated light by modulating the first light, and light intensity distribution data for generating the second modulated light by modulating the second light. The light intensity distribution data for generating the first modulated light by modulating the first light includes can include light intensity distribution data for increasing the viscosity of the imprint material IM at an arbitrary point of the pattern formation region of the substrate S and strengthening bonding force exerted between the substrate S and the mold M via the imprint material IM.

In the partial curing process C according to the fourth exemplary embodiment, light for increasing the viscosity of the imprint material in the peripheral portion of the shot region is emitted (frame exposure is performed). In the fourth exemplary embodiment, light for reducing relative vibration between the substrate S and the mold M is emitted onto the shot region in place of the deformation process D according to the first and second exemplary embodiments.

In addition, a period (timing, time length) of a vibration control exposure process in which the vibration control exposure is performed can be determined so as to reduce relative vibration between the substrate S and the mold M by partially increasing the viscosity of the imprint material IM and strengthening bonding force exerted between the substrate S and the mold M.

In this manner, by using the common modulation unit 130 (the DMD 133) for light sources with different distributions of irradiated regions on the substrate, it is possible to provide a mechanism of increasing the viscosity of the imprint material in the peripheral portion of the shot region (frame exposure), without complicating the structure of the apparatus.

Hereinafter, a fifth exemplary embodiment will be described. In the first and second exemplary embodiments, the description has been given of a case where two types of light including the first modulated light and the second modulated light that have different wavelengths or distributions are emitted onto the substrate. A light source unit 20 according to the fifth exemplary embodiment may be provided with a mechanism of emitting third modulated light onto the substrate in addition to the first modulated light and the second modulated light.

For example, the light source unit 20 illustrated in FIG. 2 can include a third light source that emits third light having a third wavelength band. The third light source can be controlled by a third controller. In this case, the first modulated light can be light having a light intensity distribution for deforming the shot region into a target shape, the second modulated light can be light for increasing the viscosity of the imprint material in the peripheral portion of the shot region, and the third modulated light can be light for enhancing a convergence property of alignment.

When sequentially emitting light from the plurality of light sources onto the substrate, it is possible to execute both of the frame exposure and the vibration control exposure in the partial curing process C in FIGS. 3A and 3B. In a case where both of the frame exposure and the vibration control exposure are executed in the partial curing process C, typically, the frame exposure is executed prior to the vibration control exposure. This is because it is desirable to execute the vibration control exposure during the alignment process, and complete the vibration control exposure immediately before the curing process.

In this manner, by using the common modulation unit 130 (the DMD 133) for light sources having different wavelengths, it is possible to provide a mechanism of deforming the substrate and a mechanism of increasing the viscosity of the imprint material (vibration control exposure mechanism), without complicating the structure of the apparatus. Additionally, the common modulation unit 130 can also be used for light sources with different distributions of irradiated regions on the substrate. In addition, the light source unit 20 can further include another light source.

Manufacturing Method of Product

The pattern of cured material formed using the imprint apparatus is permanently used in at least part of various products, or temporarily used in manufacturing various products. A product is, for example, an electrical circuit element, an optical element, a microelectromechanical system (MEMS), a recording element, a sensor, or a mold. Examples of the electrical circuit element include a volatile or nonvolatile semiconductor memory such as a dynamic random access memory (DRAM), a static RAM (SRAM), a flash memory, or a magnetic RAM (MRAM), and a semiconductor element such as a large-scale integrated circuit (LSI), a charge-coupled device (CCD) sensor, an image sensor, or an FPGA. Examples of the optical element include a microlens, a light guide member, a waveguide, an antireflection film, a diffraction grating, a polarization element, a color filter, a light-emitting element, a display, and a solar battery. Examples of the MEMS include a DMD, a micro flow path, and an electromechanical transduction element. Examples of the recording element include an optical disc such as a compact disc (CD) or a digital versatile disc (DVD), a magnetic disc, a magneto-optic disc, and a magnetic head. Examples of the sensor include a magnetic sensor, an optical sensor, and a gyro sensor. Examples of the mold include an imprinting mold.

The pattern of the cured material is directly used as a component of at least part of the above-described products, or temporarily used as a resist mask. After etching or ion implantation is performed in a processing process of the substrate, the resist mask is removed.

Figure 7A:
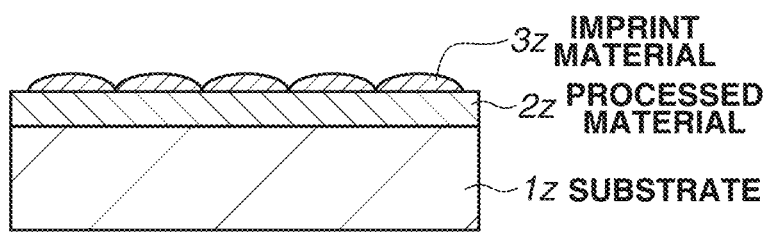
FIGS. 7A to 7F are diagrams each illustrating an example of a product manufacturing method.

Next, a product manufacturing method of forming a pattern on a substrate using an imprint apparatus, processing the substrate on which the pattern is formed, and manufacturing a product from the processed substrate will be described. As illustrated in FIG. 7A, a substrate 1z, such as a silicon wafer, that has a surface on which processed material 2z, such as insulating material, is formed is prepared, and subsequently, imprint material 3z is applied onto the surface of the processed material 2z by an inkjet method or the like. FIG. 7A illustrates a state in which the imprint material 3z shaped into a plurality of droplets is applied on the substrate 1z.

Figure 7B:
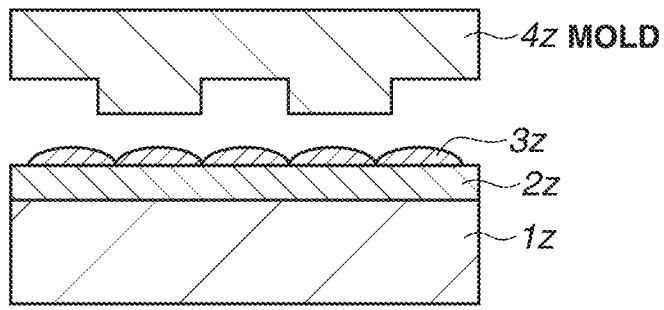
Figure 7C:
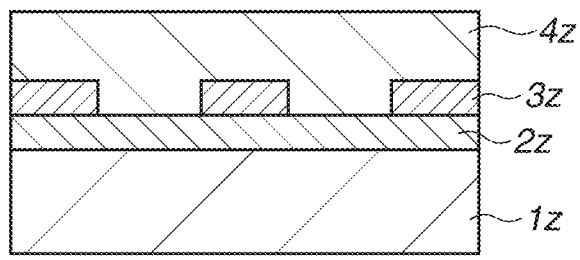

As illustrated in FIG. 7B, an imprinting mold 4z is caused to face the imprint material 3z on the substrate 1z such that a side on which an uneven pattern is formed faces the imprint material 3z. As illustrated in FIG. 7C, the substrate 1z on which the imprint material 3z is applied and the mold 4z are brought into contact with each other, and pressure is added. A clearance gap between the mold 4z and the processed material 2z is filled with the imprint material 3z. If light is emitted in this state via the mold 4z as curing energy, the imprint material 3z is cured.

Figure 7D:
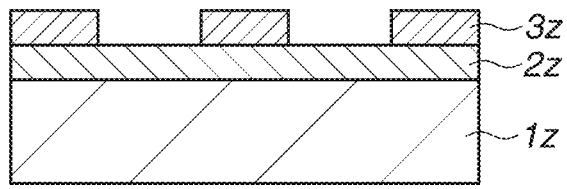

As illustrated in FIG. 7D, if the mold 4z and the substrate 1z are separated from each other after the imprint material 3z is cured, a pattern of cured material of the imprint material 3z is formed on the substrate 1z. The pattern of the cured material has a shape in which a recessed portion of the mold corresponds to a protruding portion of the cured material and a protruding portion of the mold corresponds to a recessed portion of the cured material. In other words, the uneven pattern of the mold 4z is transferred onto the imprint material 3z.

Figure 7E:
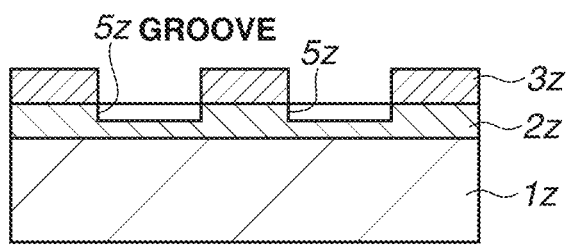
Figure 7F:
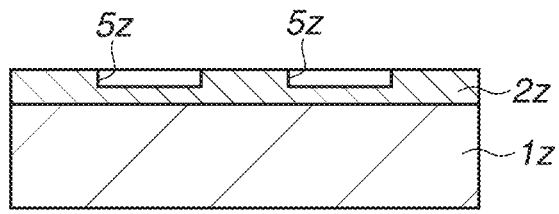

As illustrated in FIG. 7E, if etching is performed using the pattern of the cured material as an etching resistance mask, a portion having no cured material or having a thin remaining cured material in the surface of the processed material 2z is removed, and then grooves 5z are formed. As illustrated in FIG. 7F, if the pattern of the cured material is removed, a product in which the grooves 5z are formed on the surface of the processed material 2z can be obtained. Although the pattern of the cured material is removed in this example, the pattern of the cured material may not be removed and used, for example, as an interlayer insulation film included in a semiconductor element, i.e., as a component of the product.

Figure 8A:
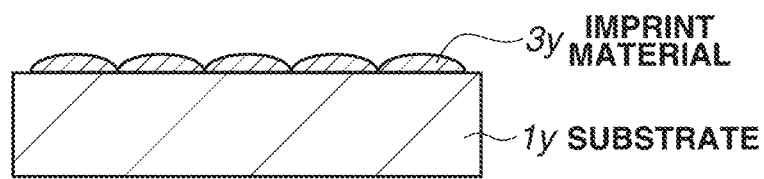
FIGS. 8A to 8D are diagrams each illustrating an example of a product manufacturing method.

Next, another manufacturing method of a product will be described. As illustrated in FIG. 8A, a substrate 1y made of material such as quartz glass is prepared, and subsequently, imprint material 3y is applied onto the surface of the substrate 1y by the inkjet method or the like. A layer made of another material such as metal or a metal compound may be provided on the surface of the substrate 1y as necessary.

Figure 8B:
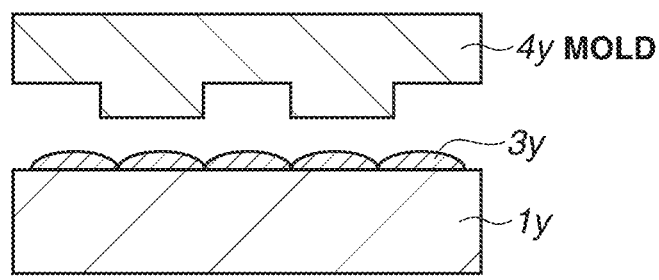
Figure 8C:
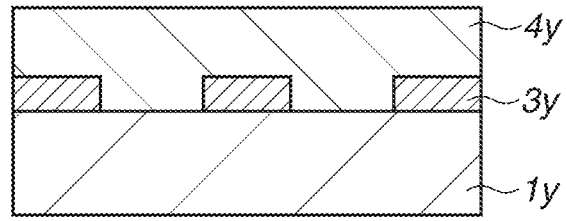

As illustrated in FIG. 8B, an imprinting mold 4y is caused to face the imprint material 3y on the substrate 1y such that a side on which an uneven pattern is formed faces the imprint material 3y. As illustrated in FIG. 8C, the substrate 1y on which the imprint material 3y is applied and the mold 4y are brought into contact with each other, and pressure is added. A clearance gap between the mold 4y and the substrate 1y is filled with the imprint material 3y. If light is emitted in this state via the mold 4y, the imprint material 3y is cured.

Figure 8D:
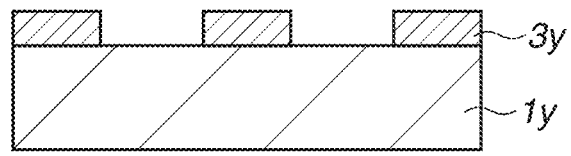

As illustrated in FIG. 8D, if the mold 4y and the substrate 1y are separated from each other after the imprint material 3y is cured, a pattern of a cured material of the imprint material 3y is formed on the substrate 1y. In this manner, a product including the pattern of the cured material as a component is obtained. In addition, if the substrate 1y is etched in the state illustrated in FIG. 8D using the pattern of the cured material as a mask, a product in which a recessed portion and a protruding portion are inversely provided with respect to the mold 4y, such as an imprinting mold, can be also be obtained.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An imprint apparatus for curing an imprint material on a substrate in a state in which the imprint material and a mold are in contact with each other comprising:
    a modulator configured to modulate incident light;
    a control unit configured to control the modulator;
    a first optical system configured to guide first light from a first light source to the modulator, and second light from a second light source to the modulator, the second light having a wavelength different from a wavelength of the first light; and
    wherein, by guiding first modulated light obtained by the modulator modulating the first light to the substrate, the substrate is deformed for alignment of the substrate and the mold,
    wherein by guiding second modulated light that partially cures the imprint material and is generated by the modulator modulating the second light to the substrate, the viscosity of imprint material supplied onto the substrate is increased, and
    wherein the control unit switches between a control of the modulator for forming a first light intensity distribution with the first light and a control of the modulator for forming a second light intensity distribution with the second light.

2. The imprint apparatus according to claim 1, wherein one of the first light and the second light is selectively incident on the modulator.

3. The imprint apparatus according to claim 1, wherein the viscosity of the imprint material is increased in a period in which alignment of the mold and the substrate is executed.

4. The imprint apparatus according to claim 1, further comprising an optical element configured to guide the second light from the second light source to an optical path between the first light source and the modulator.

5. The imprint apparatus according to claim 4, wherein the optical element is a mirror.

6. The imprint apparatus according to claim 1, wherein intensity of the first light and intensity of the second light are different from each other.

7. The imprint apparatus according to claim 1, wherein a first optical system includes an optical fiber configured to guide the first light from the first light source to the modulator.

8. The imprint apparatus according to claim 1,
    wherein the modulator includes a digital mirror device, and wherein control is performed so that the period in which neither the first modulated light nor the second modulated light are emitted to the substrate is generated by turning off the digital mirror device.

9. The imprint apparatus according to claim 1, further comprising:

a curing light source configured to cure the imprint material, wherein the imprint material is cured by emitting light for curing the imprint material to the imprint material after the alignment is finished.

10. The imprint apparatus according to claim 9, further comprising a compound mirror configured to transmit one of light from the curing light source and light modulated by the modulator and to reflect an other light.

11. A product manufacturing method comprising:

forming a pattern on a substrate by the imprint apparatus according to claim 1; and processing the substrate on which the pattern is formed, wherein a product is manufactured from the substrate.

12. An imprint method of curing an imprint material in a state where the imprint material supplied onto a substrate is in contact with a mold, the imprint method comprising:

deforming the substrate by guiding first modulated light obtained by modulating first light from a first light source by a modulator to the substrate;

increasing viscosity of the imprint material supplied onto the substrate by guiding second modulated light obtained by modulating second light from a second light source and having a wavelength different from that of the first light by the modulator to the substrate; and switching between a control of the modulator for forming a first light intensity distribution with the first light and a control of the modulator for forming a second light intensity distribution with the second light.

13. The imprint method according to claim 12, further comprising:

aligning the mold and the substrate, wherein viscosity of the imprint material is increased in a period in which the aligning is executed.

14. The imprint method according to claim 12, further comprising:

curing the imprint material by emitting light for curing the imprint material to the imprint material from a curing light source configured to cure the imprint material after the aligning is finished.

* * * * *